United States Patent
Chen

(10) Patent No.: US 7,940,097 B2
(45) Date of Patent: May 10, 2011

(54) ALL DIGITAL PHASE LOCKED LOOP CIRCUIT

(75) Inventor: Chun-Liang Chen, Tainan County (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 0 days.

(21) Appl. No.: 12/575,050

(22) Filed: Oct. 7, 2009

(65) Prior Publication Data

US 2010/0141314 A1 Jun. 10, 2010

(30) Foreign Application Priority Data

Dec. 9, 2008 (TW) .............................. 97147863 A

(51) Int. Cl.
*H03L 7/06* (2006.01)
(52) U.S. Cl. ........................................ 327/158; 327/149
(58) Field of Classification Search .................. None
See application file for complete search history.

(56) References Cited

U.S. PATENT DOCUMENTS

| | | | | |
|---|---|---|---|---|
| 7,483,508 B2* | 1/2009 | Staszewski et al. | ........... | 375/376 |
| 7,557,623 B2* | 7/2009 | Moehlmann et al. | ......... | 327/156 |
| 7,609,756 B2* | 10/2009 | Wood | ............................. | 341/155 |
| 7,714,668 B2* | 5/2010 | Yoshida et al. | ................. | 331/16 |
| 7,719,366 B2* | 5/2010 | Tsuda | ............................. | 331/17 |
| 7,791,384 B2* | 9/2010 | Lee et al. | ....................... | 327/158 |
| 7,795,937 B2* | 9/2010 | Smith et al. | .................... | 327/158 |
| 7,839,221 B2* | 11/2010 | Kossel et al. | .................... | 331/16 |
| 7,859,344 B2* | 12/2010 | Uozumi et al. | ................ | 331/1 A |
| 2004/0196937 A1* | 10/2004 | Wang et al. | ..................... | 375/355 |
| 2005/0258908 A1 | 11/2005 | Mitric | | |
| 2008/0191750 A1* | 8/2008 | Wang | ............................. | 327/106 |
| 2009/0296532 A1* | 12/2009 | Hsieh | ............................. | 368/120 |
| 2010/0277211 A1* | 11/2010 | Geng et al. | ..................... | 327/158 |
| 2010/0289541 A1* | 11/2010 | Wu | ................................ | 327/158 |
| 2010/0315140 A1* | 12/2010 | Mayer et al. | ................... | 327/159 |

FOREIGN PATENT DOCUMENTS

CN 1442955 A 9/2003

* cited by examiner

*Primary Examiner* — Lincoln Donovan
*Assistant Examiner* — Adam D Houston
(74) *Attorney, Agent, or Firm* — WPAT, PC; Justin King

(57) ABSTRACT

An all digital phase locked loop circuit includes a reference frequency indicator for receiving a reference signal with a reference frequency and generating a frequency indicating value; a phase frequency detector for comparing the reference signal with a frequency divided signal and generating a phase difference pulse; a time-to-digital circuit for receiving the phase difference pulse and a plurality of output signals and generating a phase difference value; a digital controller for receiving the frequency indicating value and the phase difference value and generating a control value; a delta-sigma modulator for modulating the control value and generating a modulated control value; a DCO for receiving the modulated control value and generating an output oscillating signal with a digital controlled frequency; a frequency divider for dividing the digital controlled frequency to generate the frequency divided signal; and a multi-phase generator for receiving the output oscillating signal and generating the output signals.

22 Claims, 16 Drawing Sheets

ALL DIGITAL PHASE LOCKED LOOP CIRCUIT

FIELD OF THE INVENTION

The present invention relates to a phase locked loop circuit (PLL), and more particularly, to an all digital PLL having self-calibration of loop stability and bandwidth and a phase locked system without regard to process, supplied voltage, and temperature.

BACKGROUND OF THE INVENTION

Please refer to FIG. 1. FIG. 1 is a diagram illustrating a conventional analog phase locked loop circuit 100 according to prior art. The analog phase locked loop circuit 100 consists of a phase frequency detector 10, a charge pump 20, a loop filter 30, a voltage controlled oscillator 40, and a frequency divider 50. A reference signal ($S_{ref}$) 11 with a reference frequency ($F_{ref}$) is generated by a reference oscillator (not shown), and the reference signal ($S_{ref}$) 11 and a frequency divided signal ($S_{fd}$) 52 are simultaneously inputted to the phase frequency detector 10. The phase frequency detector 10 is capable of detecting a phase difference as well as a frequency difference between the reference signal ($S_{ref}$) 11 and the frequency divided signal ($S_{fd}$) 52, and then outputs a phase difference signal 12 to the charge pump 20. Afterwards, the charge pump 20 generates an output current 22 related to the phase difference signal 12 to the loop filter 30 according to the phase difference signal 12. The loop filter 30 is a low pass filter (LPF) composed of a resistor (R) and a capacitor (C). In theory, the loop filter 30 is able to average the output current 22 and transform it into a voltage controlled signal 32 to the voltage controlled oscillator 40. The voltage controlled oscillator 40 is able to generate an output voltage controlled oscillating signal ($S_{VCO}$) 42 according to the voltage controlled signal 32, wherein the output voltage controlled oscillating signal ($S_{VCO}$) 42 has a voltage controlled frequency ($F_{VCO}$). The frequency divider 50 is capable of receiving the output voltage controlled oscillating signal ($S_{VCO}$) 42 and dividing the output voltage controlled oscillating signal ($S_{VCO}$) 42 by an integer N to generate the frequency divided signal ($S_{fd}$) 52 to be inputted to the phase frequency detector 10. Therefore, an equation $F_{VCO}=N*F_{ref}$ can be obtained by the analog phase locked loop circuit 100.

Since the phase difference signal 12, the output current 22, and the voltage controlled signal 32 are all analog signals, the phase locked loop circuit 100 including the abovementioned elements is called as an analog phase locked loop circuit.

In addition, please refer to FIG. 2, which is a diagram illustrating an s-domain model of an analog phase loop circuit. A function for the phase frequency detector combined with charge pump 25 is represented by $I_{CP}/2\pi$; a function for the loop filter 30 is represented by $Z(s)$; a function for the voltage controlled oscillator 40 is represented by $K_{VCO}/s$; and a function for the frequency divider 50 is represented by $1/N$; wherein $I_{CP}$ represents the output current 22 of the charge pump 20, $K_{VCO}$ represents a tuning sensitivity of the voltage controlled oscillator 40.

The conventional analog phase locked loop circuit has the following disadvantages: design modifications are required with different processes, and the voltage controlled oscillator 40 is sensitive to noises. In order to solve such disadvantages of the analog phase locked loop circuit, an all digital PLL has already been developed.

Compared with the analog phase locked loop circuit, the signals delivered between the components of the all digital PLL are all digital values. For this reason, the phase or transmission path correction of the all digital PLL won't be interfered by noises, and the all digital PLL can directly follow the evolution of the contracting process.

Please refer to FIG. 3A. FIG. 3A is a diagram illustrating a conventional all digital phase locked loop circuit 200 according to prior art. The all digital phase locked loop circuit 200 includes a phase frequency detecting and time-to-digital circuit 125, a digital controller 130, a delta-sigma modulator 135, a digital controlled oscillator 140, and a frequency divider 150. A reference signal ($S_{ref}$) 111 having a reference frequency ($F_{ref}$) is generated by a reference oscillator (not shown), and the reference signal ($F_{ref}$) 111 as well as a frequency divided signal ($S_{fd}$) 152 are simultaneously inputted to the phase frequency detecting and time-to-digital circuit 125. The phase frequency detecting and time-to-digital circuit 125 is capable of detecting a phase difference and a frequency difference between the reference signal ($S_{ref}$) 111 and the frequency divided signal ($S_{fd}$) 152 and generating a phase difference value 122 in response to them. After that, the digital controller 130 receives and processes the phase difference value 122 to generate a control value 132. The delta-sigma modulator 135 modulates the received control value 132 and generates a modulated control value 134 in response to the control value 132. The digital controlled oscillator 140 generates an output oscillating signal ($S_{DCO}$) 142 according to the modulated control value 134, wherein the output oscillating signal ($S_{DCO}$) 142 has a digital controlled frequency ($F_{DCO}$). The frequency divider 150 is capable of receiving the output oscillating signal ($S_{DCO}$) 142 and dividing the output oscillating signal ($S_{DCO}$) 142 by an integer N so as to generate the frequency divided signal ($S_{fd}$) 152 to be inputted to the phase frequency detecting and time-to-digital circuit 125. Therefore, an equation $F_{DCO}=N*F_{ref}$ can be obtained by the all digital phase locked loop circuit 200. Please note that the digital controller 130 of the all digital phase locked loop circuit 200 can be simulated as a digital loop filter, and the delta-sigma module 135 is used for increasing a resolution of the voltage controlled frequency $F_{VCO}$ when it changes.

All of the phase difference value 122, the control value 132, and the modulated control value 134 are digital values, so that the phase locked loop circuit 200 composed of the abovementioned components is called as an all digital phase locked loop circuit.

Please refer to FIG. 3B. FIG. 3B is a diagram illustrating a conventional phase frequency detecting and time-to-digital circuit according to prior art. This phase frequency detecting and time-to-digital circuit includes n inverters 201~20n, n D-type flip-flops 211~21n, and a pseudo-thermometer-code edge detector 230. The n inverters 201~20n are cascaded into a delay chain, wherein an input terminal of the first inverter 201 is used for receiving the frequency divided signal ($S_{fd}$), and a propagation delay of each inverter is represented by ΔTDC. Each of the D-type flip-flops 211~21n has a data input terminal (D) respectively coupled to the corresponding output terminal inv1~invn of the inverters 201~20n, and each of the D-type flip-flops 201~20n has a clock input terminal coupled to the reference signal ($S_{ref}$). Moreover, an inverted output terminal ($\overline{Q}$) of the D-type flip-flops with an odd number is coupled to the pseudo-thermometer-code edge detector 230, and a non-inverted output terminal (Q) of the D-type flip-flops with an even number is coupled to the pseudo-thermometer-code edge detector 230. As a result, the n D-type flip-flops 211~21n are capable of outputting a signal of n-bits Q[1]~Q[n].

As can be known from FIG. 3B, the delay chain composed of the n inverters 201~20n is capable of generating a group of delayed signals inv1~invn of the frequency divided signal ($S_{fd}$). After the time difference between the frequency divided signal ($S_{fd}$) and the reference signal ($S_{ref}$) is sampled, the phase relationship between the frequency divided signal ($S_{fd}$) and the reference signal ($S_{ref}$) can be obtained.

For example, please refer to FIG. 3C. FIG. 3C is a diagram illustrating the signals of the phase frequency detecting and time-to-digital circuit. Take eight inverters 201~208 as the example, wherein the propagation delay of each inverter is represented by Δt. Therefore, eight delayed signals inv1~inv8 of the frequency divided signal ($S_{fd}$) can be obtained. In addition, assume that the delayed signals inv1~inv8 are sampled at the rising edge of the reference signal ($S_{ref}$), and thus we can obtain that Q[1:8]=[100111100]. Therefore, we can make sure that the time difference between the frequency divided signal ($S_{fd}$) and the reference signal ($S_{ref}$) is equal to the total propagation time of the six inverters 201~206. The pseudo-thermometer-code edge detector 230 is capable of receiving the signal of 8-bits Q[1]~Q[8] and transforming it into the phase difference value 122 according their sampled positions. In this case, the resolved phase difference value 122 is equal to 6.

Please refer to FIG. 3D. FIG. 3D is a diagram illustrating a digital controller. The digital controller consists of a proportional control unit 240, an integrating control unit 242, a first adder 244, a second adder 246, and a delay unit ($Z^{-1}$) 248. The proportional control unit 240 is capable of receiving the phase difference value 122 and multiplying the phase difference value 122 by the numeric of $K_P$ so as to output a proportional value 241. The integrating control unit 242 is capable of receiving the phase difference value 122 and multiplying the phase difference value 122 by the numeric of $K_I$ so as to output an integral value 243. The delay unit ($Z^{-1}$) 248 is capable of receiving the control value 132 and outputting a delay value 249. The first adder 244 adds the delay value 249 and the integral value 243 together so as to get a first value 245. The second adder 246 adds the first value 245 and the proportional value 241 together so as to get the control value 132. From all the considerations above, the digital controller can be simulated as a digital loop filter.

Furthermore, the delta-sigma modulator 135 is used for increasing a resolution of the voltage controlled frequency $F_{VCO}$ when it changes. Since the control value 132 represents an integer value, the variations of the control value 132 are all integer variations. For example, the control value 132 can be increased from an integer 5 (0101) into another integer 6 (0110); or it can be decreased from an integer 5 (0101) into another integer 4 (0100). The delta-sigma modulator 135 can modulate the control value 132, so that the integer variations of the control value 132 are changed into fractional variations. That is to say, the modulated control value 134 can be increased from an integer 5 into 5.1, 5.2, . . . , and so on; or it can be decreased from an integer 5 into 4.9, 4.8, . . . , and so on. For this reason, the modulated control value 134 is able to increase the resolution of the voltage controlled frequency $F_{VCO}$ when it changes. However, the delta-sigma modulator 135 has been widely applied to the phase locked loop circuit, and further description is omitted herein.

Please refer to FIG. 3E. FIG. 3E is a diagram illustrating a first kind of digital controlled oscillator. The digital controlled oscillator consists of a bias current source (IBIAS) 252, a digital-to-analog converting matrix 254, a current-to-voltage converter 256, and a voltage controlled oscillator 258. The bias current source (IBIAS) 252 is capable of providing a plurality of current sources with different currents to the digital-to-analog converting matrix 254. The digital-to-analog converting matrix 254 receives the modulated control value 134, and divides the modulated control value 134 into a row value and a column value for enabling/disabling a number of current sources among the bias current source 252. The enabled current sources are aggregated into an analog current signal 255 to be inputted to the current-to-voltage converter 256. The current-to-voltage converter 256 can further convert the analog current signal 255 into an analog voltage signal 257 to be inputted to the voltage controlled oscillator 258, so as to generate an output oscillating signal ($S_{DCO}$) 142.

Please refer to FIG. 3F. FIG. 3F is a diagram illustrating a second kind of digital controlled oscillator. The digital controlled oscillator consists of a bias current source (IBIAS) 252, a digital-to-analog converting matrix 254, and a current controlled oscillator 259. The bias current source 252 is capable of providing a plurality of current sources with different currents to the digital-to-analog converting matrix 254. The digital-to-analog converting matrix 254 receives the modulated control value 134, and divides the modulated control value 134 into a row value and a column value for enabling/disabling a number of current sources among the bias current source 252. The enabled current sources are aggregated into an analog current signal 255 to be inputted to the current controlled oscillator 259. The current controlled oscillator 259 can further convert the analog current signal 255 into the output oscillating signal ($S_{DCO}$) 142.

Moreover, please refer to FIG. 4. FIG. 4 is a diagram illustrating an s-domain model of a conventional all digital phase locked loop circuit. A function for the phase frequency detecting and time-to-digital circuit 125 is represented by $[T_{ref}/2\pi]*1/\Delta TDC$; a function for the loop filter 130 is represented by H(s); a function for the voltage controlled oscillator 140 is represented by $K_{DCO}/s$; and a function for the frequency divider 150 is represented by 1/N; wherein $T_{ref}$ represents a period of the reference signal ($S_{ref}$) and is equal to (1/$F_{ref}$), ΔTDC is a propagation delay of the inverter, and $K_{DCO}$ represents a tuning sensitivity of the digital controlled oscillator 140.

Regardless of the analog phase locked loop circuit or the all digital phase locked loop circuit, those skilled in the art should maintain a loop dynamics and a damping factor (ζ) at a fixed value as far as possible. The loop dynamics is equal to $\omega_n/\omega_{ref}$, wherein $\omega_n$ represents the loop bandwidth, and $\omega_{ref}$ represents the loop operating speed (i.e., $2\pi F_{ref}$).

In a $2^{nd}$ order analog phase locked loop circuit, $$\omega_n = \sqrt{\frac{I_{CH} \cdot K_{VCO}}{N \cdot C}},$$

and the damping factor is represented by an equation:

$$\zeta = \frac{1}{2}\sqrt{\frac{1}{N} \cdot I_{CH} \cdot K_{VCO} \cdot R^2 \cdot C}.$$

The symbol "$I_{CH}$" represents the output current of the charge pump, the symbol "$K_{VCO}$" represents a tuning sensitivity of the voltage controlled oscillator, the symbol "N" represents the divisor of the frequency divider, the symbol "C" represents the capacitance of the loop filter, and the symbol "R" represents the resistance of the loop filter.

Similarly, in an all digital phase locked loop circuit, $$\omega_n = \sqrt{\frac{\frac{1}{\Delta_{TDC} \cdot F_{ref}} \cdot K_{DCO}}{N \cdot \frac{1}{K_I \cdot F_{ref}}}},$$

and the damping factor is represented by an equation:

$$\zeta = \frac{K_P}{2} \sqrt{\frac{1}{N} \cdot \frac{1}{\Delta_{TDC} \cdot F_{ref}} \cdot K_{DCO} \cdot \frac{1}{K_I \cdot F_{ref}}}.$$

The symbol "$\Delta TDC$" represents the propagation delay of the inverter, the symbol "$K_{DCO}$" represents a tuning sensitivity of the voltage controlled oscillator, the symbol "N" represents the divisor of the frequency divider, the numeric of $K_P$ is provided by the proportional control unit 240, the numeric of $K_I$ is provided by the integrating control unit 242, and the symbol "$F_{ref}$" means the reference frequency.

However, in order to provide an adjustable digital controlled frequency ($F_{DCO}$) with a large range, the loop dynamics and the damping factor of the conventional all digital phase locked loop circuit are unable to be maintained at a fixed value. In addition, owing to the changes of the process, the supply voltage, and the temperature, the inverters of the conventional phase frequency detecting and time-to-digital circuit 125 will generate an error substantially equaling four times of $\Delta TDC$, and the digital controlled oscillator 140 will generate a variation substantially equaling three times of $K_{DCO}$. Moreover, the numeric of $K_P$ provided by the proportional control unit 240 and the numeric of $K_I$ provided by the integrating control unit 242 must be controlled by a trimming register. Since the variations of the numeric of $K_P$ as well as the numeric of $K_I$ exceed $2^{nd}$ orders (i.e., 100 times), the design for the trimming register will occupy a large layout area in the all digital phase locked loop circuit.

Please refer to FIG. 5A together with FIG. 5B. FIG. 5A and FIG. 5B are variation diagrams of a numeric of $K_P$ and a numeric of $K_I$ in the all digital phase locked loop circuit with a fixed reference signal. As can be known from FIG. 5A, when the digital controlled frequency ($F_{DCO}$) varies from 6 MHz to 400 MHz, the numeric of $K_P$ varies from $2^{-12}$ to $2^{-5}$ in order to maintain the loop parameters as $\zeta=1$ and $\omega_n/\omega_{ref}=1/50$. Similarly, when the digital controlled frequency ($F_{DCO}$) varies from 6 MHz to 400 MHz, the numeric of $K_I$ varies from $2^{-16}$ to $2^{-9}$. For these reasons, the trimming register must store the corresponding numeric of $K_P$ and the corresponding numeric of $K_I$ when the digital controlled frequency ($F_{DCO}$) changes. The abovementioned embodiment is presented for illustrating a condition with a fixed reference frequency. If the reference frequency changes, more trimming registers are required for storing the numeric of $K_P$ and the numeric of $K_I$.

SUMMARY OF THE INVENTION

It is therefore one of the objectives of the present invention to provide an all digital phase locked loop circuit without regard to process, supplied voltage, and temperature. The all digital phase locked loop circuit is able to easily maintain its loop dynamics as well as its damping factor at fixed values.

According to an exemplary embodiment of the present invention, an all digital phase locked loop circuit is provided. The all digital phase locked loop circuit includes a primary loop having a phase locked function and a secondary loop acted as a loop stability auxiliary. The all digital phase locked loop circuit consists of a reference frequency indicator, a phase frequency detector, a time-to-digital circuit, a digital controller, a delta-sigma modulator, a digital controlled oscillator, a frequency divider, and a multi-phase generator. The reference frequency indicator receives a reference signal and generates a frequency indicating value in response to the reference signal, wherein the reference signal has a reference frequency. The phase frequency detector is capable of comparing the reference signal with a frequency divided signal and generating a phase difference pulse. The time-to-digital circuit is capable of receiving the phase difference pulse and a plurality of output signals, and generating a phase difference value. The digital controller is capable of receiving the phase difference value and the frequency indicating value, and generating a control value. The delta-sigma modulator is capable of modulating the control value and generating a modulated control value in response to the control value. The digital controlled oscillator is capable of receiving the modulated control value and outputting an output oscillating signal in response to the modulated control value, wherein the output oscillating signal has a digital controlled frequency. The frequency divider is capable of receiving the output oscillating signal and dividing the digital controlled frequency of the output oscillating signal by a divisor to generate the frequency divided signal. The multi-phase generator is capable of receiving the output oscillating signal and generating the plurality of output signals in response to the output oscillating signal, wherein there is a fixed phase difference existed between the plurality of output signals.

In addition, according to another exemplary embodiment of the present invention, an all digital phase locked loop circuit is provided. The all digital phase locked loop circuit consists of a phase frequency detector, a time-to-digital circuit, a digital controller, a delta-sigma modulator, a digital controlled oscillator, a frequency divider, and a multi-phase generator. The phase frequency detector is capable of comparing a reference signal with a frequency divided signal and generating a phase difference pulse. The time-to-digital circuit is capable of receiving the phase difference pulse and a plurality of output signals, and generating a phase difference value. The digital controller is capable of receiving the phase difference value and the frequency indicating value, and generating a control value. The delta-sigma modulator is capable of modulating the control value and generating a modulated control value in response to the control value. The digital controlled oscillator is capable of receiving the modulated control value and outputting an output oscillating signal in response to the modulated control value, wherein the output oscillating signal has a digital controlled frequency. The frequency divider is capable of receiving the output oscillating signal and dividing the digital controlled frequency of the output oscillating signal by a divisor to generate the frequency divided signal. The multi-phase generator is capable of receiving the output oscillating signal and generating the plurality of output signals in response to the output oscillating signal, wherein there is a fixed phase difference existed between the plurality of output signals.

Moreover, according to another exemplary embodiment of the present invention, an all digital phase locked loop circuit is provided. The all digital phase locked loop circuit consists of a reference frequency indicator, a phase frequency detecting and time-to-digital circuit, a digital controller, a delta-sigma modulator, a digital controlled oscillator, and a frequency divider. The reference frequency indicator receives a reference signal and generates a frequency indicating value in response to the reference signal, wherein the reference signal has a reference frequency. The phase frequency detecting and time-to-digital circuit is capable of comparing the reference signal with a frequency divided signal and generating a phase difference value. The digital controller is capable of receiving the phase difference value and the frequency indicating value, and generating a control value. The delta-sigma modulator is capable of modulating the control value and generating a modulated control value in response to the control value. The digital controlled oscillator is capable of receiving the modulated control value and outputting an output oscillating signal in response to the modulated control value, wherein the output oscillating signal has a digital controlled frequency. The frequency divider is capable of receiving the output oscillating signal and dividing the digital controlled frequency of the output oscillating signal by a divisor to generate the frequency divided signal.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF THE PREFERRED EMBODIMENT

Figure 6:
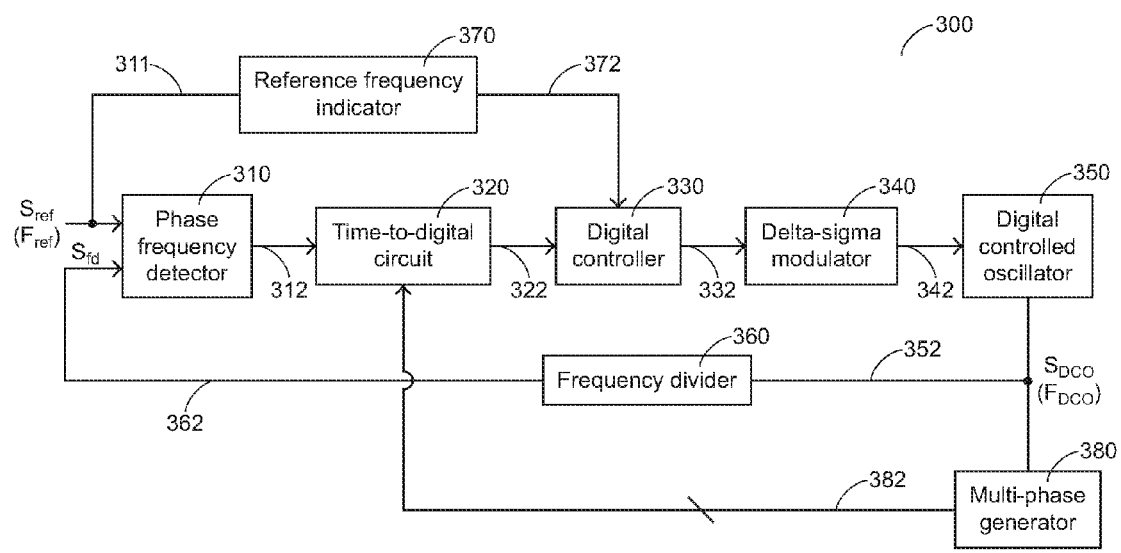
FIG. 6 is a diagram showing an all digital phase locked loop circuit according to an embodiment of the present invention.

Please refer to FIG. 6. FIG. 6 is a diagram showing an all digital phase locked loop circuit 300 according to an embodiment of the present invention. The all digital phase locked loop circuit 300 consists of a phase frequency detector 310, a time-to-digital circuit (TDC) 320, a digital controller 330, a delta-sigma modulator 340, a digital controlled oscillator 350, a frequency divider 360, a reference frequency indicator 370, and a multi-phase generator 380.

According to an embodiment of the present invention, the multi-phase generator 380 receives an output oscillating signal ($S_{DCO}$) 352 generated from the digital controlled oscillator 350, and generates m output signals 382, wherein each of the m output signals 382 has an identical digital controlled frequency ($F_{DCO}$), and there is a fixed phase difference existed between each of the output signals 382. In addition, the reference frequency indicator 370 is capable of receiving a reference signal ($S_{ref}$) 311 and generating a frequency indicating value 372 according to variations of the reference frequency ($F_{ref}$) to the digital controller 330, so as to control a numeric of $K_P$ as well as a numeric of $K_I$ in the digital controller 330. The descriptions of the all digital phase locked loop circuit 300 disclosed in the present invention is detailed in the following:

The reference signal ($S_{ref}$) 311 having a reference frequency ($F_{ref}$) can be generated by a reference oscillator (not shown). In addition, the reference signal ($S_{ref}$) 311 as well as a frequency divided signal ($S_{fd}$) 362 are simultaneously inputted to the phase frequency detector 310, and then a phase difference pulse 312 is generated in response to them. The time-to-digital circuit 320 is capable of receiving the phase difference pulse 312 together with the m output signals 382 and generating a phase difference value 322. After that, the digital controller 330 receives the phase difference value 322 and the frequency indicating value 372 to generate a control value 332. The delta-sigma modulator 340 modulates the control value 332 and generates a modulated control value 342 in response to the control value 332. The digital controlled oscillator generates an output oscillating signal ($S_{DCO}$) 352 according to the modulated control value 342, wherein the output oscillating signal ($S_{DCO}$) 352 has a digital controlled frequency ($F_{DCO}$). The frequency divider 360 is capable of receiving the output oscillating signal ($S_{DCO}$) 352, and dividing the digital controlled frequency ($F_{DCO}$) of the output oscillating signal ($S_{DCO}$) 352 by an integer N to generate the frequency divided signal ($S_{fd}$) 362 to be inputted to the phase frequency detector 310. Consequently, an equation $F_{DCO}=N*F_{ref}$ can be obtained by the all digital phase locked loop circuit 300. Please note that the digital controller 330 of the all digital phase locked loop circuit 300 can be simulated as a digital loop filter, and the delta-sigma modulator 340 is used for increasing a resolution of the voltage controlled frequency FVCO when it changes. All of the phase difference value 322, the control value 332, the modulated control value 342, and the frequency indicating value 372 of the all digital phase locked loop circuit 300 disclosed in the present invention are digital values.

Figure 7A:
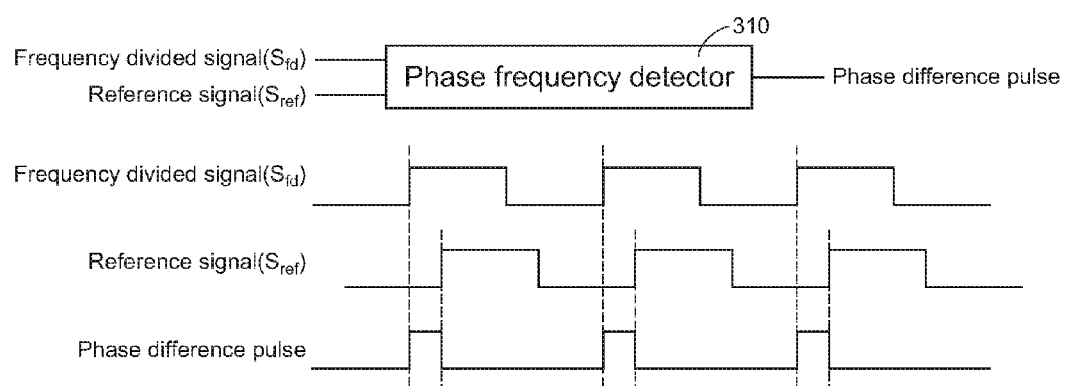
FIG. 7A is a diagram showing a phase frequency detector and a phase difference pulse according to an embodiment of the present invention.

Please refer to FIG. 7A. FIG. 7A is a diagram showing a phase frequency detector and a phase difference pulse according to an embodiment of the present invention. The phase frequency detector 310 receives the reference signal ($S_{ref}$) and the frequency divided signal ($S_{fd}$), and then generate a phase difference pulse. As can be known from FIG. 7A, when the frequency divided signal ($S_{fd}$) is at the rising edge, the phase difference pulse is transformed from the low logic level into the high logic level; and when the reference signal ($S_{ref}$) is at the rising edge, the phase difference pulse is transformed from the high logic level into the low logic level.

Figure 7B:
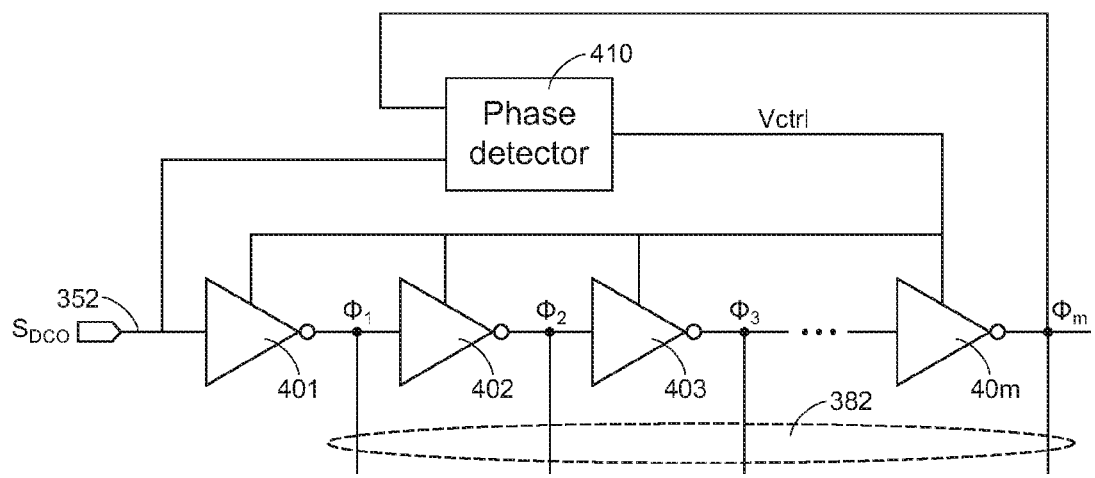
FIG. 7B is a diagram showing a multi-phase generator according to an embodiment of the present invention.

Please refer to FIG. 7B. FIG. 7B is a diagram showing a multi-phase generator according to an embodiment of the present invention. The multi-phase generator is implemented by a delay locked loop (DLL). This DLL consists of a phase detector 410 and m inverters 401~40m. These m inverters 401~40m are cascaded to each other, wherein the first inverter 401 is used for receiving the output oscillating signal ($S_{DCO}$) 352. The phase detector 410 receives the output oscillating signal ($S_{DCO}$) 352 and an $m^{th}$ phase signal ($\Phi_m$) outputted from the last inverter 40m, and generates a control voltage (Vctrl) to each control terminal of the m inverters 401~40m in order to control a delay time of the m inverters 401~40m. Therefore, the DLL 400 is able to generate m phase signals $\Phi_1$~$\Phi_m$, wherein there is a fixed phase difference existed between the m phase signals $\Phi_1$~$\Phi_m$. Furthermore, a delay time $\Delta_{TDC}$ between each inverter as well as this fixed phase difference will not be changed as process, supply voltages, or temperature change. The m phase signals mentioned above are namely the m output signals 382 generated by the multi-phase generator 380.

Figure 7C:
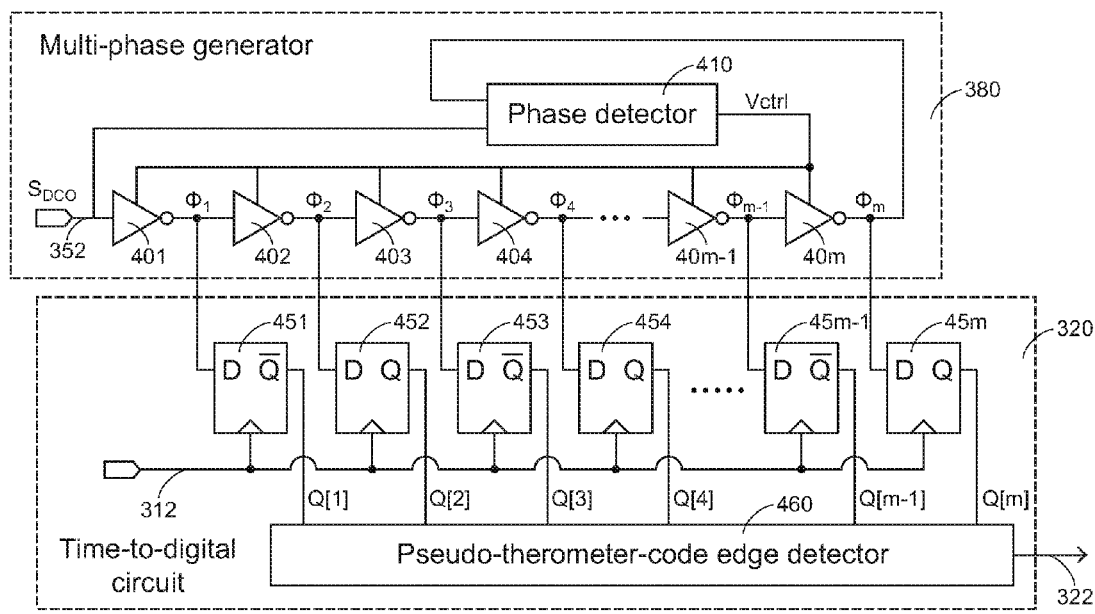
FIG. 7C is a diagram showing a multi-phase generator combined with a time-to-digital circuit according to an embodiment of the present invention.

Please refer to FIG. 7C. FIG. 7C is a diagram showing a multi-phase generator combined with a time-to-digital circuit according to an embodiment of the present invention. The time-to-digital circuit consists of m D-type flip-flops 451~45m and a pseudo-thermometer-code edge detector 460, wherein each of the D-type flip-flops has a data input terminal (D) used for receiving the corresponding phase signals $\Phi_1$~$\Phi_m$ outputted from the in inverters 401~40m, and each of the D-type flip-flops has a clock input terminal used for receiving the phase difference pulse 312. Furthermore, an inverted output terminal ($\overline{Q}$) of the D-type flip-flops with an odd number is coupled to the pseudo-thermometer-code edge detector 460, and a non-inverted output terminal (Q) of the D-type flip-flops with an even number is coupled to the pseudo-thermometer-code edge detector 460. Therefore, the m D-type flip-flops 401~40m are able to output a signal of m-bits Q[1]~Q[m]. The pseudo-thermometer-code edge detector 460 can transform the signal of m-bits Q[1]~Q[m] into the phase difference value 322.

Figure 7D:
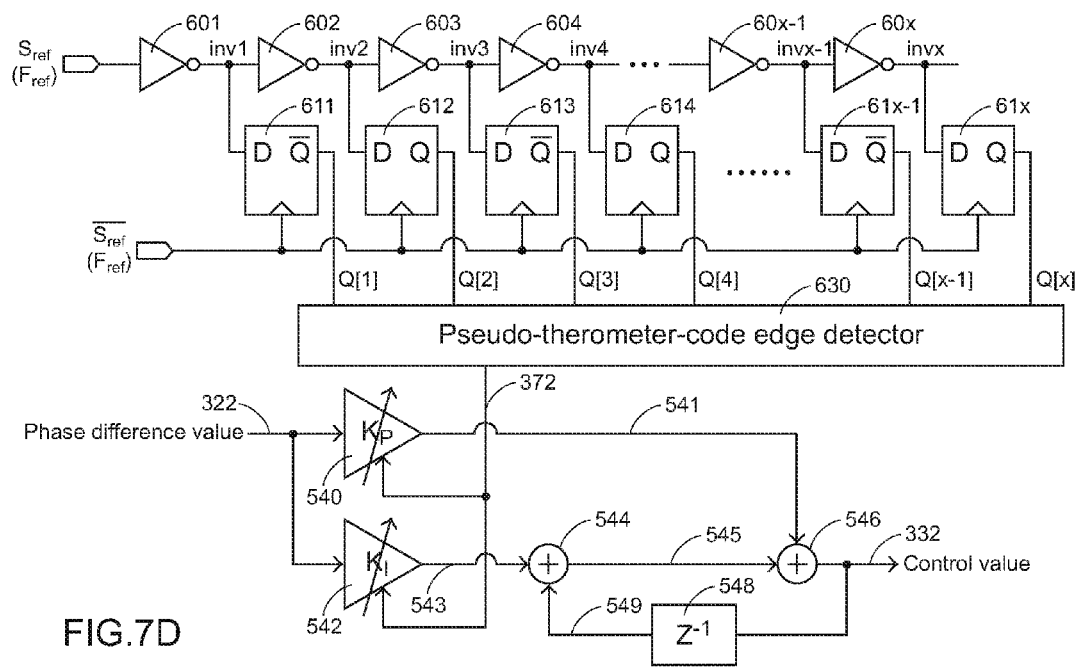
FIG. 7D is a diagram showing a reference frequency indicator combined with a digital controller according to an embodiment of the present invention.

Please refer to FIG. 7D. FIG. 7D is a diagram showing a reference frequency indicator combined with a digital controller according to an embodiment of the present invention. The reference frequency indicator 370 includes x inverters 601~60x, x D-type flip-flops 611~61x, and a pseudo-thermometer-code edge detector 630. The x inverters 601~60x are cascaded into a delay chain, wherein an input terminal of the first inverter 601 is used for receiving the reference signal ($S_{ref}$). Each of the x D-type flip-flops 601~60x has a data input terminal (D) respectively coupled to the corresponding output terminal inv1~invx of the inverters 601~60x, and each of the D-type flip-flops has a clock input terminal coupled to the inverted reference signal ($\overline{S_{ref}}$). Moreover, an inverted output terminal ($\overline{Q}$) of the D-type flip-flops with an odd number is coupled to the pseudo-thermometer-code edge detector 630, and a non-inverted output terminal (Q) of the D-type flip-flops with an even number is coupled to the pseudo-thermometer-code edge detector 630. It is clear, therefore, that variations of the reference frequency ($F_{ref}$) can be known by reference to the values of Q[1]~Q[x]. The pseudo-thermometer-code edge detector 630 can transform the signal of x-bits Q[1]~Q[x] into the frequency indicating value 372.

Furthermore, the digital controller includes a proportional control unit 540, an integrating control unit 542, a first adder 544, a second adder 546, and a delay unit ($Z^{-1}$) 548. The proportional control unit 540 receives the phase difference value 322, and multiplies the phase difference value 322 by a numeric of $K_P$ so as to output a proportional value 541. The integrating control unit 542 receives the phase difference value 322, and multiplies the phase difference value 322 by a numeric of $K_I$ so as to output an integral value 543. The delay unit ($Z^{-1}$) 548 receives the control value 332 and outputs a delay value 549. The first adder 544 adds the delay value 549 and the integral value 543 together so as to get a first value 545. The second adder 546 adds the first value 545 and the proportional value 541 together so as to get the control value 332. From all the considerations above, the digital controller can be simulated as a digital loop filter. Additionally, the numeric of $K_P$ of the proportional control unit 540 as well as the numeric of $K_I$ of the integrating control unit 542 are controlled by the frequency indicating value 372 outputted from the reference frequency indicator 570. That is to say, the numeric of $K_P$ and the numeric of $K_I$ change as the reference frequency changes. As a result, a number of conventional trimming registers can be significantly decreased in order to reduce the layout area.

Figure 1:
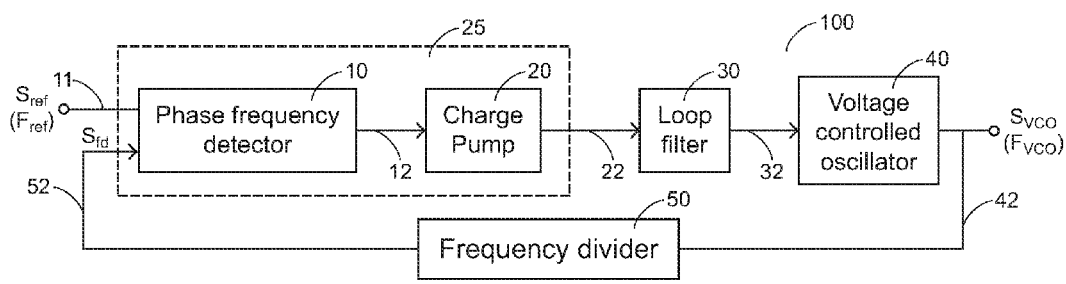
FIG. 1 is a diagram illustrating a conventional analog phase locked loop circuit according to prior art.
Figure 2:
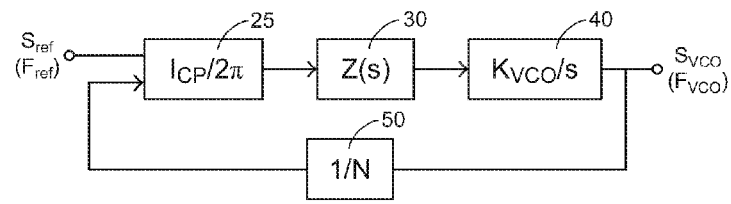
FIG. 2 is a diagram illustrating an s-domain model of an analog phase loop circuit.
Figure 7E:
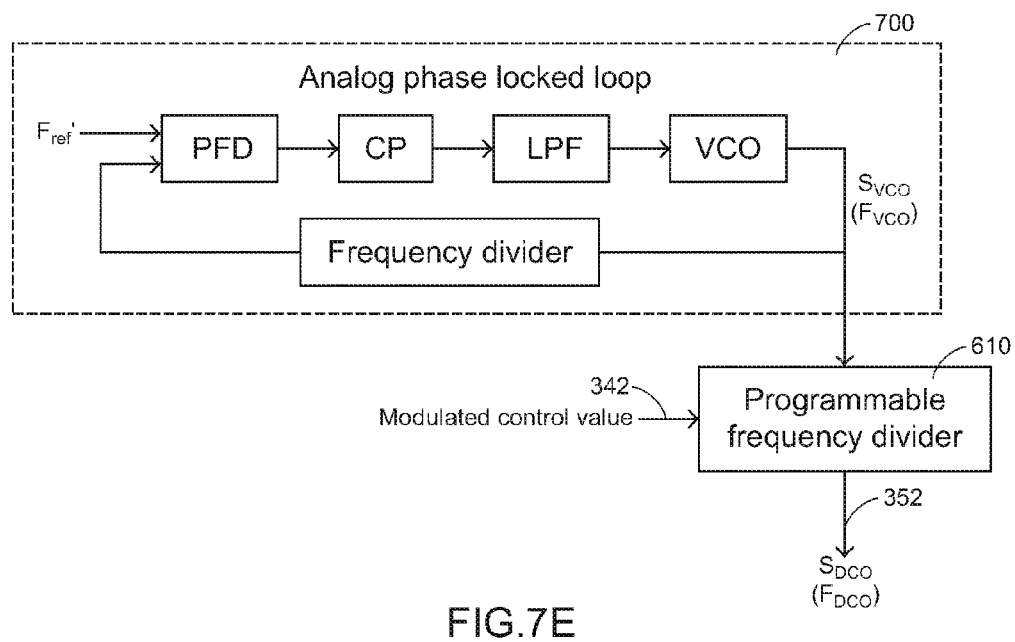
FIG. 7E is a diagram showing a digital controlled oscillator according to an embodiment of the present invention.

Please refer to FIG. 7E. FIG. 7E is a diagram showing a digital controlled oscillator according to an embodiment of the present invention. The digital controlled oscillator includes: an analog phase locked loop circuit 700 and a programmable frequency divider 610. The architecture of the analog phase locked loop circuit 700 is the same as that of the analog phase locked loop circuit shown in FIG. 1, and further description is omitted herein. The analog phase locked loop circuit 700 is capable of outputting an output voltage controlled oscillating signal ($S_{VCO}$) with a voltage controlled frequency ($F_{VCO}$). The programmable frequency divider 610 receives the modulated control value and changes a divisor of the programmable frequency divider 610 according to the modulated control value, so that the output oscillating signal ($S_{DCO}$) 352 with a digital controller frequency ($F_{DCO}$) is generated by dividing the voltage controlled frequency ($F_{VCO}$) by the divisor of the programmable frequency divider 610. A tuning sensitivity corresponding to this novel digital controlled oscillator is defined as $$K_{DCO} = \frac{F_{VCO}}{L} = \frac{F'_{ref} \times M}{L^2},$$

wherein M represents the divider of the analog phase locked loop circuit 700, and L represents the divider of the programmable frequency divider 610. Owing to the dividers M and L are pre-defined numerals, they won't be changed as process, supply voltages, or temperature change. That is to say, the term $K_{DCO}$ is a fixed value.

Figure 3A:
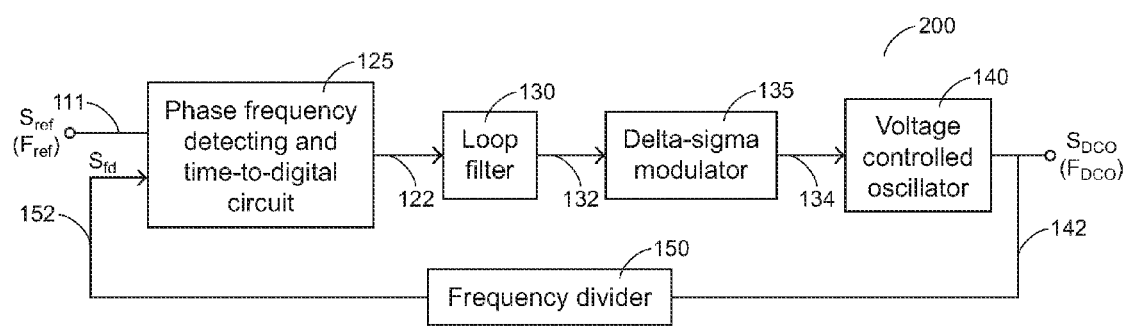
FIG. 3A is a diagram illustrating a conventional all digital phase locked loop circuit according to prior art.
Figure 3B:
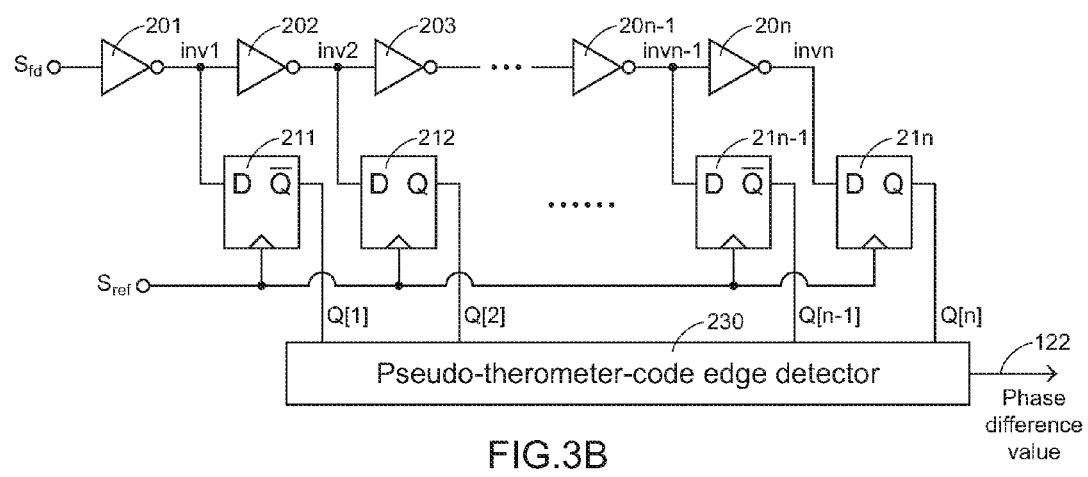
FIG. 3B is a diagram illustrating a conventional phase frequency detecting and time-to-digital circuit according to prior art.
Figure 3C:
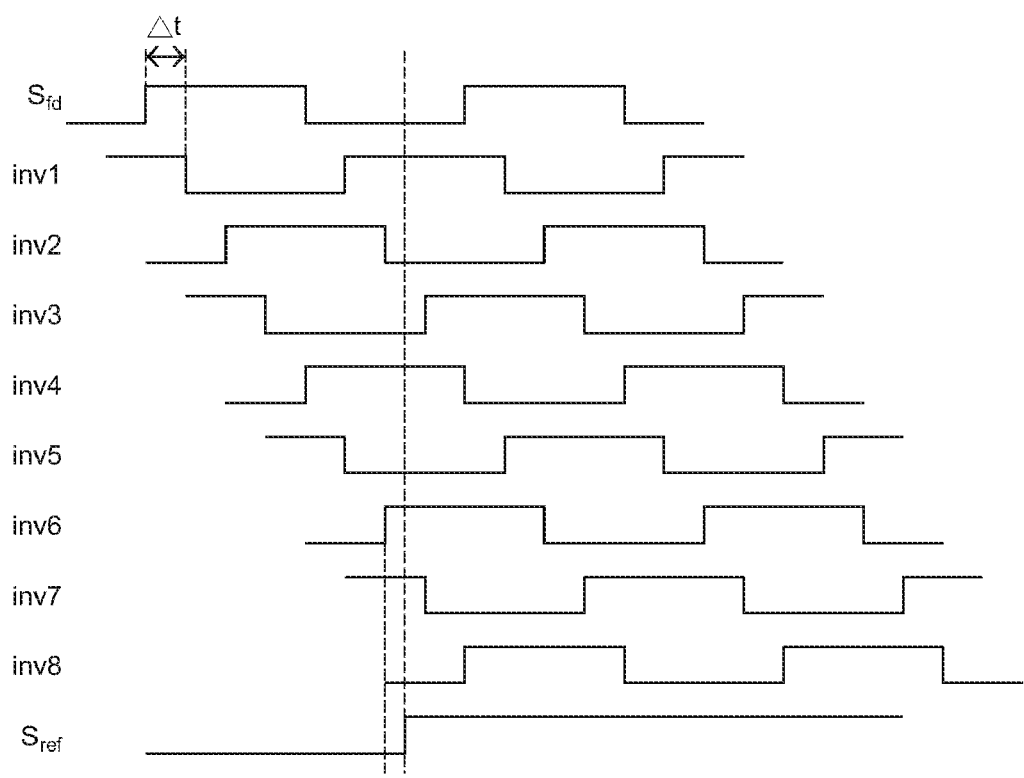
FIG. 3C is a diagram illustrating the signals of the phase frequency detecting and time-to-digital circuit.
Figure 3D:
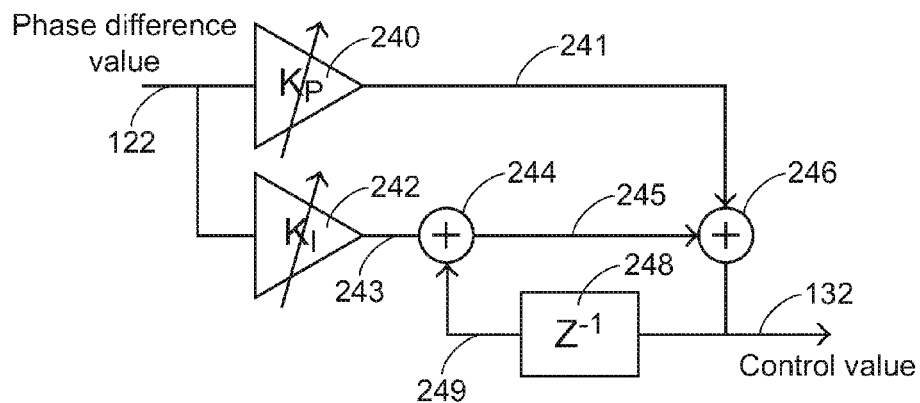
FIG. 3D is a diagram illustrating a digital controller.
Figure 3E:
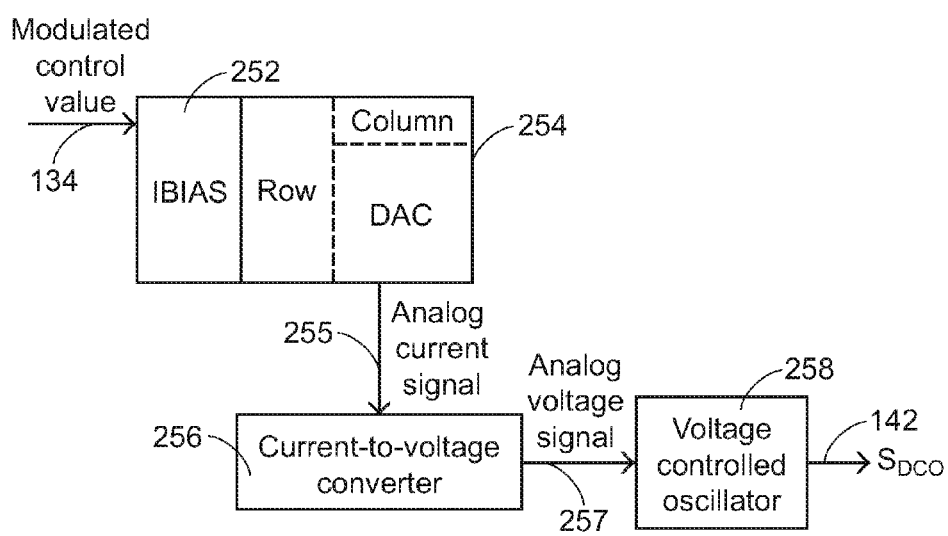
FIG. 3E is a diagram illustrating a first kind of digital controlled oscillator.
Figure 3F:
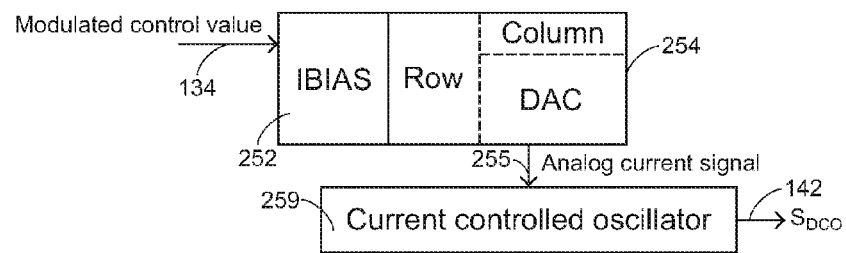
FIG. 3F is a diagram illustrating a second kind of digital controlled oscillator.
Figure 4:
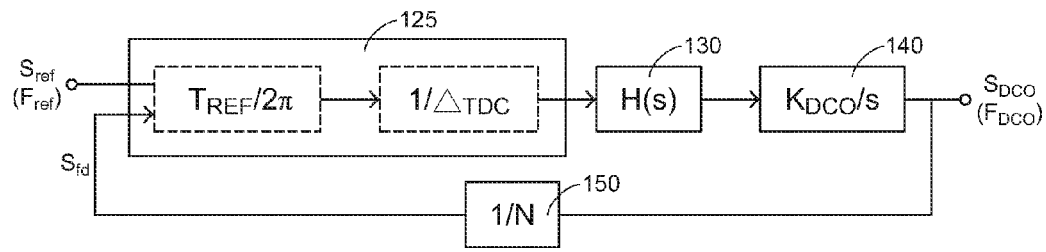
FIG. 4 is a diagram illustrating an s-domain model of a conventional all digital phase locked loop circuit.
Figure 5A:
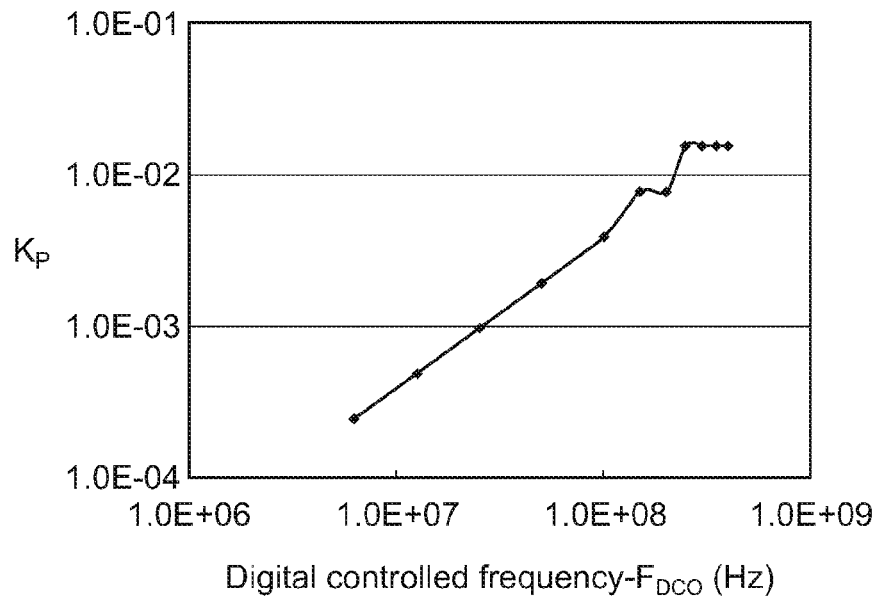
FIG. 5A and FIG. 5B are variation diagrams of a numeric of $K_P$ and a numeric of $K_I$ in the all digital phase locked loop circuit with a fixed reference signal.
Figure 5B:
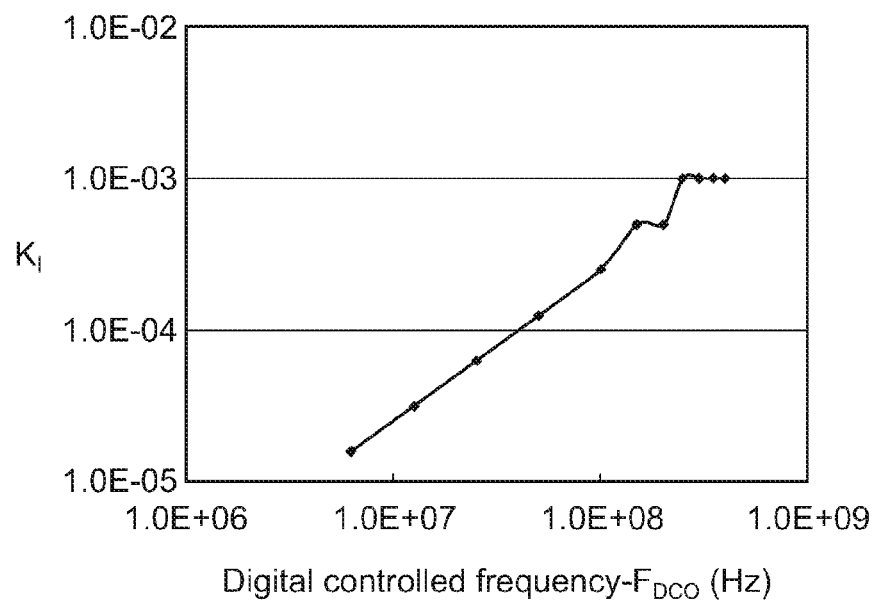

Certainly, the digital controlled oscillator 350 of the all digital phase locked loop circuit 300 disclosed in the present invention is not limited. That is to say, besides the digital controlled oscillator shown in FIG. 7E, the digital controlled oscillator shown in FIG. 3D or FIG. 3E can be used to implement the digital controlled oscillator 350 of the all digital phase locked loop circuit 300 disclosed in the present invention.

In addition, as for the all digital phase locked loop circuit is concerned, $$\omega_n = \sqrt{\frac{\frac{1}{\Delta_{TDC} \cdot F_{ref}} \cdot K_{DCO}}{N \cdot \frac{1}{K_I \cdot F_{ref}}}}.$$

Therefore, its loop dynamics can be represented as $$\omega_n / \omega_{ref} = \sqrt{\frac{\frac{1}{\Delta_{TDC} \cdot F_{ref}} \cdot K_{DCO}}{N \cdot \frac{1}{K_I \cdot F_{ref}}}} \cdot \frac{1}{2\pi \cdot F_{ref}} = \sqrt{\frac{\frac{1}{\Delta_{TDC} \cdot F_{ref}} \cdot K_{DCO}}{N \cdot \frac{1}{K_I} \cdot F_{ref}}} \cdot \frac{1}{2\pi}.$$

Obviously, as FIG. 7C depicts, a term $$"\frac{1}{\Delta_{TDC} \cdot F_{ref}}"$$

is direct proportional to N. Accordingly, the loop dynamics "$\omega_n/\omega_{ref}$" is direct proportional to $$\sqrt{\frac{K_I}{F_{ref}}}.$$

Furthermore, in the all digital phase locked loop circuit, the numeric of $K_P$ can be set to be direct proportional to the numeric of $K_I$. Form FIG. 7C, we can see that a term $$"\frac{1}{\Delta_{TDC} \cdot F_{ref}}"$$

is direct proportional to N. Accordingly, its damping factor, represented by the equation:

$$\zeta = \frac{K_P}{2} \sqrt{\frac{1}{N} \cdot \frac{1}{\Delta_{TDC} \cdot F_{ref}} \cdot K_{DCO} \cdot \frac{1}{K_I \cdot F_{ref}}},$$

is direct proportional to $$\sqrt{\frac{K_I}{F_{ref}}}.$$

As can be known from FIG. 7D, the numeric of $K_P$ and the numeric of $K_I$ are controlled by the frequency indicating value 372. Accordingly, the reference frequency ($F_{ref}$) can be direct proportional to the numeric of $K_I$. Finally, we can see that the loop dynamics, represented by $\omega_n/\omega_{ref}$, is a fixed value; and the damping factor is a fixed value as well.

Figure 8A:
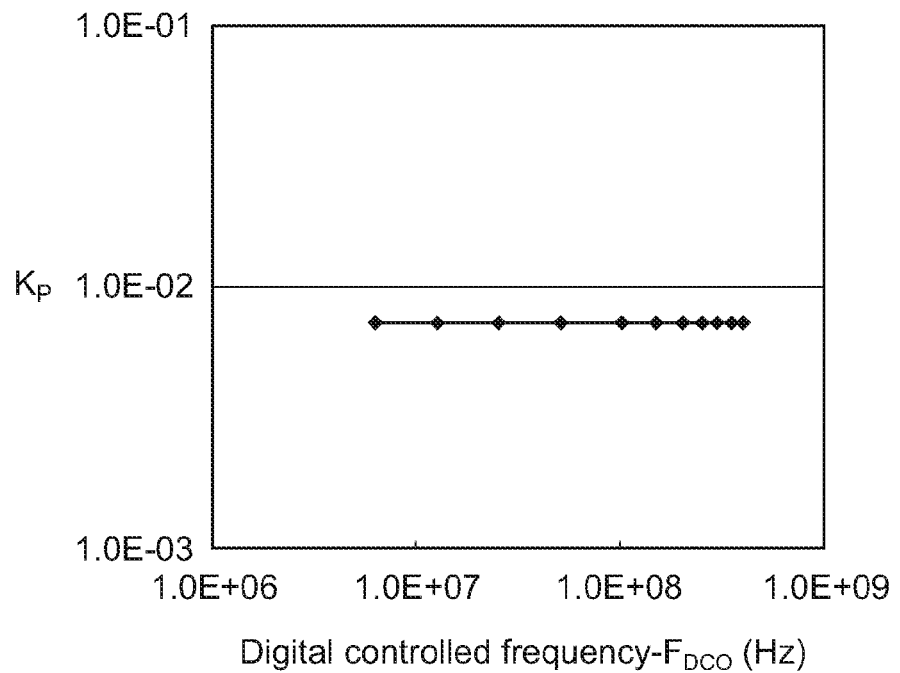
FIG. 8A and FIG. 8B are variation diagrams of a numeric of $K_P$, a numeric of $K_I$, and an output oscillating frequency in the all digital phase locked loop circuit with a fixed reference signal according to an embodiment of the present invention.
Figure 8B:
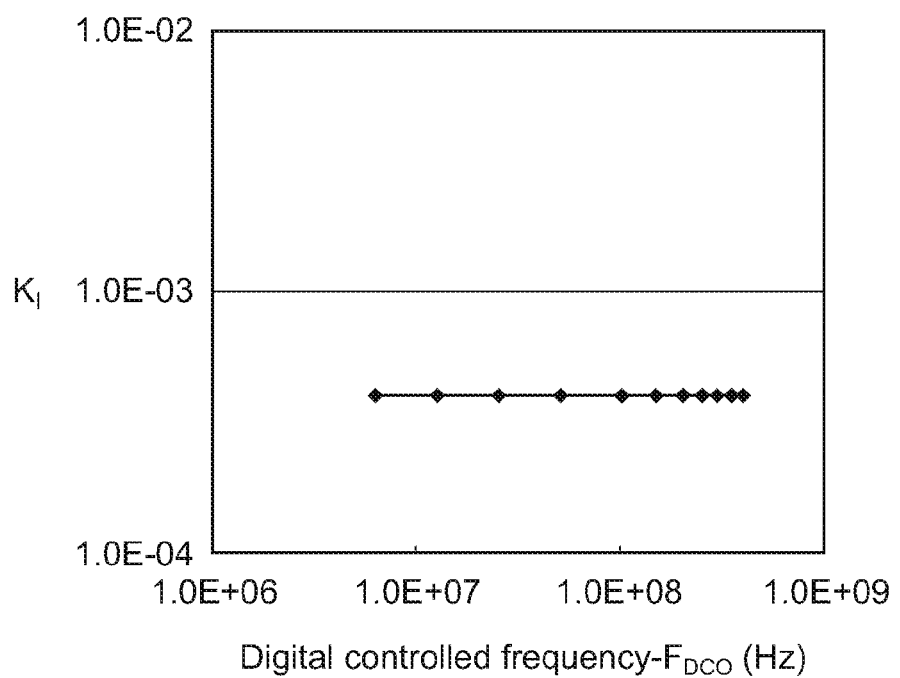

Please refer to FIG. 8A together with FIG. 8B. FIG. 8A and FIG. 8B are variation diagrams of a numeric of $K_P$, a numeric of $K_I$, and an output oscillating frequency in the all digital phase locked loop circuit with a fixed reference signal according to an embodiment of the present invention. As can be known from FIG. 8A and FIG. 8B, when the digital controlled frequency ($F_{DCO}$) varies from 6 MHz to 400 MHz, both the numeric of $K_P$ and the numeric of $K_I$ maintain at a fixed value. In other words, the numeric of $K_P$ and the numeric of $K_I$ inside the digital controller 300 of the all digital phase locked loop circuit 300 disclosed in the present invention are irrelevant to variations of the digital controlled frequency ($F_{DCO}$).

Figure 9A:
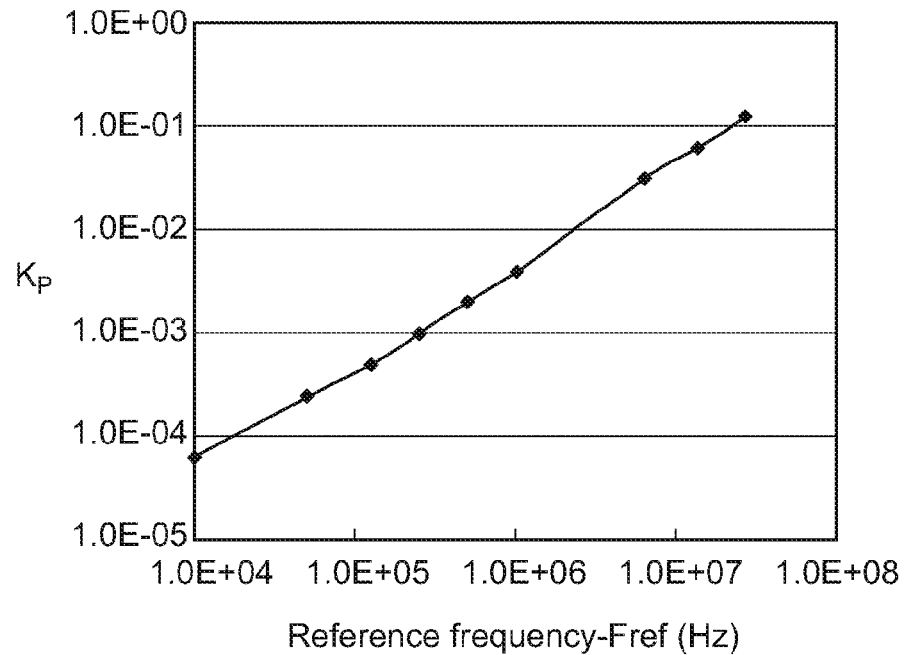
FIG. 9A and FIG. 9B are variation diagrams of a numeric of $K_P$ and a numeric of $K_I$ in the all digital phase locked loop circuit with a varied reference signal according to an embodiment of the present invention.
Figure 9B:
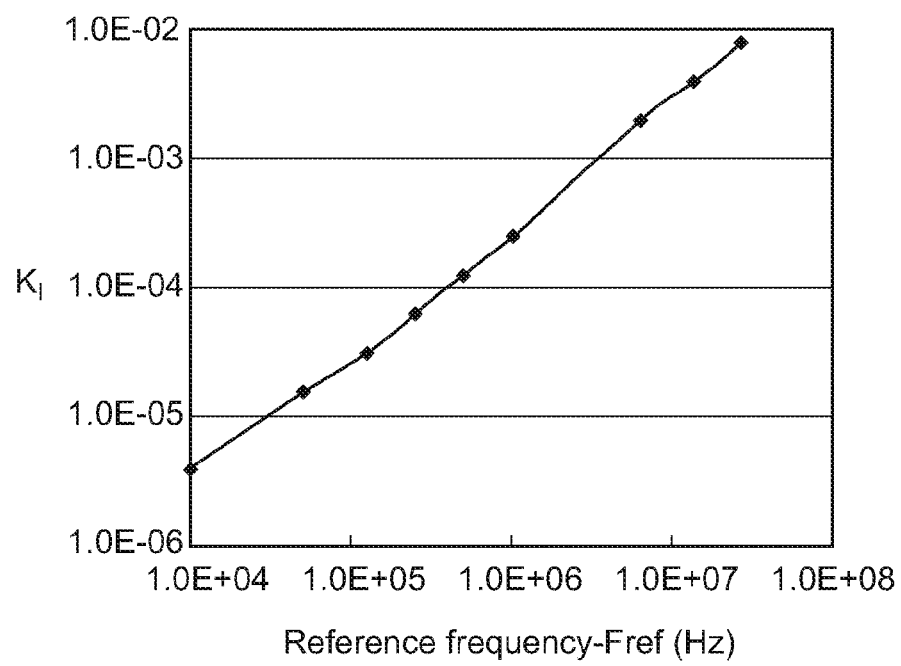

Please refer to FIG. 9A together with FIG. 9B. FIG. 9A and FIG. 9B are variation diagrams of a numeric of $K_P$ and a numeric of $K_I$ in the all digital phase locked loop circuit with a varied reference signal according to an embodiment of the present invention. As FIG. 9A and FIG. 9B depicts, when the reference frequency ($F_{ref}$) varies from 0.01 MHz to 10 MHz, both the numeric of $K_P$ and the numeric of $K_I$ increase as the reference frequency ($F_{ref}$) increases.

Figure 10A:
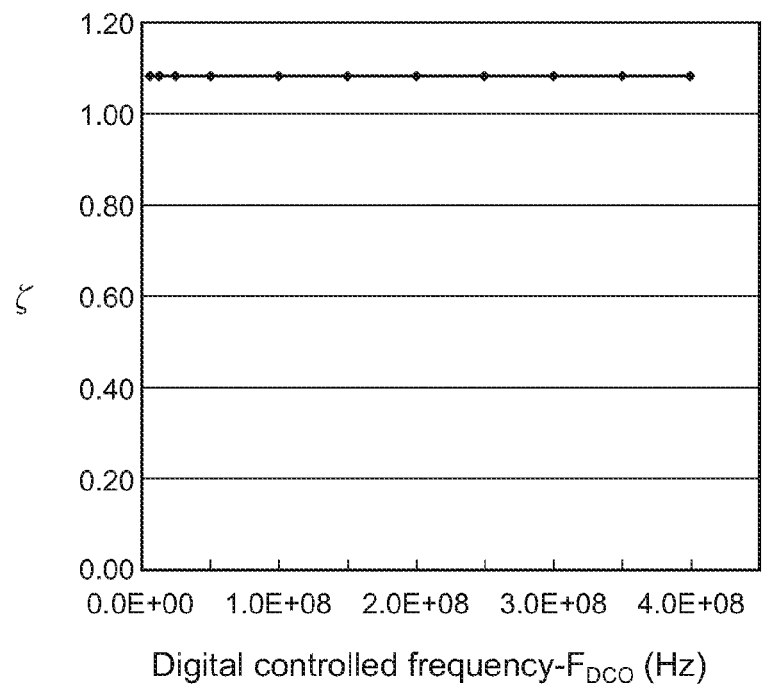
FIG. 10A and FIG. 10B are diagrams illustrating a variation relationship between a damping factor, a loop dynamics, and an output oscillating frequency of the all digital phase locked circuit according to an embodiment of the present invention.
Figure 10B:
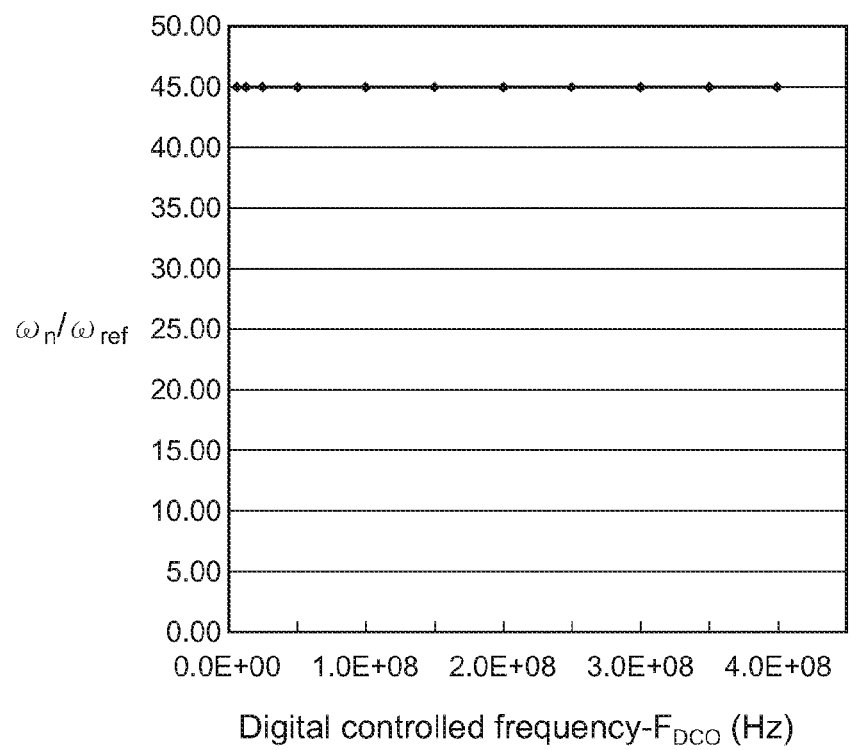

Please refer to FIG. 10A together with FIG. 10B. FIG. 10A and FIG. 10B are diagrams illustrating a variation relationship between a damping factor, a loop dynamics, and an digital controlled frequency of the all digital phase locked circuit according to an embodiment of the present invention. Obviously, both the damping factor and the loop dynamics are a fixed value. Namely, the damping factor and the loop dynamics will not change as the digital controlled frequency ($F_{DCO}$) changes.

Moreover, compared with the conventional all digital phase locked loop circuit, a reference frequency indicator 370 as well as a multi-phase generator 380 are added into the all digital phase locked loop circuit disclosed in the present invention. Certainly, those skilled in the art could make use of only one of the reference frequency indicator and the multi-phase generator together with the conventional all digital phase locked loop circuit, therefore, the efficiency of the all digital phase locked loop circuit can also be improved.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An all digital phase locked loop circuit, comprising:
    a reference frequency indicator, for receiving a reference signal and for generating a frequency indicating value in response to the reference signal, wherein the reference signal has a reference frequency;
    a phase frequency detector, comparing the reference signal with a frequency divided signal, and generating a phase difference pulse;
    a time-to-digital circuit, receiving the phase difference pulse and a plurality of output signals, and generating a phase difference value;
    a digital controller, receiving the phase difference value and the frequency indicating value, and generating a control value;
    a delta-sigma modulator, modulating the control value and generating a modulated control value in response to the control value;
    a digital controlled oscillator (DCO), receiving the modulated control value and outputting an output oscillating signal in response to the modulated control value, wherein the output oscillating signal has a digital controlled frequency;

a frequency divider, receiving the output oscillating signal and dividing the digital controlled frequency of the output oscillating signal by a divisor to generate the frequency divided signal; and a multi-phase generator, receiving the output oscillating signal and generating the plurality of output signals in response to the output oscillating signal, wherein there is a fixed phase difference existed between the plurality of output signals.

2. The all digital phase locked loop circuit of claim 1, wherein the reference frequency indicator comprises:

x inverters, cascaded to each other, wherein an input terminal of the first inverter is used for receiving the reference signal;

x D-type flip-flops, each of the D-type flip-flops having a data input terminal respectively coupled to an output terminal of the corresponding inverter, and each of the D-type flip-flops having a clock input terminal for receiving an inverted reference signal, wherein the inverted reference signal is a reverse of the reference signal; and a pseudo-thermometer-code edge detector, coupled to each inverted output terminal of the D-type flip-flops with an odd number as well as each non-inverted output terminal of the D-type flip-flops with an even number among the x D-type flip-flops, for generating the frequency indicating value.

3. The all digital phase locked loop circuit of claim 1, wherein the multi-phase generator comprises:

m inverters, cascaded to each other, the m inverters having m output terminals generating m phase signals, the m phase signals being the plurality of output signals, wherein an input terminal of the first inverter is used for receiving the output oscillating signal, and an output terminal of the last inverter is used for outputting an $m^{th}$ phase signal; and a phase detector, for comparing the output oscillating signal with the $m^{th}$ phase signal, and for generating a control voltage to each control terminal of the m inverters.

4. The all digital phase locked loop circuit of claim 1, wherein the time-to-digital circuit comprises:

m D-type flip-flops, each of the D-type flip-flops having a data input terminal respectively coupled to the corresponding output signal, and each of the D-type flip-flops having a clock input terminal for receiving the phase difference pulse; and a pseudo-thermometer-code edge detector, coupled to an inverted output terminal of the D-type flip-flops with an odd number as well as a non-inverted output terminal of the D-type flip-flops with an even number among the in D-type flip-flops, for generating the phase difference value.

5. The all digital phase locked loop circuit of claim 1, wherein the digital controller comprises:

a proportional control unit, for receiving the phase difference value, and for multiplying the phase difference value by a numeric of $K_P$ so as to output a proportional value, wherein the numeric of $K_P$ is controlled by the frequency indicating value;

an integrating control unit, for receiving the phase difference value, and for multiplying the phase difference value by a numeric of $K_I$ so as to output an integral value, wherein the numeric of $K_I$ is controlled by the frequency indicating value;

a delay unit, for receiving the control value, and for outputting a delay value in response to the control value;

a first adder, for adding the delay value and the integral value together so as to get a first value; and a second adder, for adding the first value and the proportional value together so as to get the control value.

6. The all digital phase locked loop circuit of claim 1, wherein the digital controlled oscillator comprises:

a bias current source, providing a plurality of current sources with different currents;

a digital-to-analog converting matrix, receiving the modulated control value, and dividing the modulated control value into a row value and a column value for enabling a part of the current sources among the bias current source, wherein the part of enabled current sources are aggregated into an analog current signal;

a current-to-voltage converter, receiving the analog current signal and converting the analog current signal into an analog voltage signal; and a voltage controlled oscillator (VCO), receiving the analog voltage signal and converting the analog voltage signal into the output oscillating signal.

7. The all digital phase locked loop circuit of claim 1, wherein the digital controlled oscillator comprises:

a bias current source, providing a plurality of current sources with different currents;

a digital-to-analog converting matrix, receiving the modulated control value, and dividing the modulated control value into a row value and a column value for enabling a part of the current sources among the bias current source, wherein the part of enabled current sources are aggregated into an analog current signal; and a current controlled oscillator, receiving the analog current signal, and converting the analog current signal into the output oscillating signal.

8. The all digital phase locked loop circuit of claim 1, wherein the digital controlled oscillator comprises:

an analog phase locked loop circuit, generating an output voltage controlled oscillating signal with a voltage controlled frequency; and a programmable frequency divider, for receiving the modulated control value and for generating a divisor, so that the output oscillating signal is generated by dividing the voltage controlled frequency of the output voltage controlled oscillating signal by the divisor.

9. An all digital phase locked loop circuit, comprising:

a phase frequency detector, comparing a reference signal with a frequency divided signal, and generating a phase difference pulse;

a time-to-digital circuit, receiving the phase difference pulse and a plurality of output signals, and generating a phase difference value;

a digital controller, receiving the phase difference value and the frequency indicating value, and generating a control value;

a delta-sigma modulator, modulating the control value and generating a modulated control value in response to the control value;

a digital controlled oscillator (DCO), receiving the modulated control value and outputting an output oscillating signal in response to the modulated control value, wherein the output oscillating signal has a digital controlled frequency;

a frequency divider, receiving the output oscillating signal and dividing the digital controlled frequency of the output oscillating signal by a divisor to generate the frequency divided signal; and a multi-phase generator, receiving the output oscillating signal and generating the plurality of output signals in response to the output oscillating signal, wherein there is a fixed phase difference existed between the plurality of output signals.

10. The all digital phase locked loop circuit of claim 9, wherein the multi-phase generator comprises:
   m inverters, cascaded to each other, the m inverters having m output terminals generating in phase signals, the m phase signals being the plurality of output signals, wherein an input terminal of the first inverter is used for receiving the output oscillating signal, and an output terminal of the last inverter is used for outputting an $m^{th}$ phase signal; and
   a phase detector, for comparing the output oscillating signal with the $m^{th}$ phase signal, and for generating a control voltage to each control terminal of the m inverters.

11. The all digital phase locked loop circuit of claim 9, wherein the time-to-digital circuit comprises:
   m D-type flip-flops, each of the D-type flip-flops having a data input terminal respectively coupled to the corresponding output signal, and each of the D-type flip-flops having a clock input terminal for receiving the phase difference pulse; and
   a pseudo-thermometer-code edge detector, coupled to an inverted output terminal of the D-type flip-flops with an odd number as well as a non-inverted output terminal of the D-type flip-flops with an even number among the m D-type flip-flops, for generating the phase difference value.

12. The all digital phase locked loop circuit of claim 9, wherein the digital controller comprises:
   a proportional control unit, for receiving the phase difference value, and for multiplying the phase difference value by a numeric of $K_P$ so as to output a proportional value, wherein the numeric of $K_P$ is controlled by the frequency indicating value;
   an integrating control unit, for receiving the phase difference value, and for multiplying the phase difference value by a numeric of $K_I$ so as to output an integral value, wherein the numeric of $K_I$ is controlled by the frequency indicating value;
   a delay unit, for receiving the control value, and for outputting a delay value in response to the control value;
   a first adder, for adding the delay value and the integral value together so as to get a first value; and
   a second adder, for adding the first value and the proportional value together so as to get the control value.

13. The all digital phase locked loop circuit of claim 9, wherein the digital controlled oscillator comprises:
   a bias current source, providing a plurality of current sources with different currents;
   a digital-to-analog converting matrix, receiving the modulated control value, and dividing the modulated control value into a row value and a column value for enabling a part of the current sources among the bias current source, wherein the part of enabled current sources are aggregated into an analog current signal;
   a current-to-voltage converter, receiving the analog current signal and converting the analog current signal into an analog voltage signal; and
   a voltage controlled oscillator (VCO), receiving the analog voltage signal and converting the analog voltage signal into the output oscillating signal.

14. The all digital phase locked loop circuit of claim 9, wherein the digital controlled oscillator comprises:
   a bias current source, providing a plurality of current sources with different currents;
   a digital-to-analog converting matrix, receiving the modulated control value, and dividing the modulated control value into a row value and a column value for enabling a part of the current sources among the bias current source, wherein the part of enabled current sources are aggregated into an analog current signal; and
   a current controlled oscillator, receiving the analog current signal, and converting the analog current signal into the output oscillating signal.

15. The all digital phase locked loop circuit of claim 9, wherein the digital controlled oscillator comprises:
   an analog phase locked loop circuit, generating an output voltage controlled oscillating signal with a voltage controlled frequency; and
   a programmable frequency divider, for receiving the modulated control value and for generating a divisor, so that the output oscillating signal is generated by dividing the voltage controlled frequency of the output voltage controlled oscillating signal by the divisor.

16. An all digital phase locked loop circuit, comprising:
   a reference frequency indicator, for receiving a reference signal and for generating a frequency indicating value in response to the reference signal, wherein the reference signal has a reference frequency;
   a phase frequency detecting and time-to-digital circuit, comparing the reference signal with a frequency divided signal, and generating a phase difference value;
   a digital controller, receiving the phase difference value and the frequency indicating value, and generating a control value;
   a delta-sigma modulator, modulating the control value and generating a modulated control value in response to the control value;
   a digital controlled oscillator (DCO), receiving the modulated control value and outputting an output oscillating signal in response to the modulated control value, wherein the output oscillating signal has a digital controlled frequency; and
   a frequency divider, receiving the output oscillating signal and dividing the digital controlled frequency of the output oscillating signal by a divisor to generate the frequency divided signal.

17. The all digital phase locked loop circuit of claim 16, wherein the reference frequency indicator comprises:
   x inverters, cascaded to each other, wherein an input terminal of the first inverter is used for receiving the reference signal;
   x D-type flip-flops, each of the D-type flip-flops having a data input terminal respectively coupled to an output terminal of the corresponding inverter, and each of the D-type flip-flops having a clock input terminal for receiving an inverted reference signal, wherein the inverted reference signal is a reverse of the reference signal; and
   a pseudo-thermometer-code edge detector, coupled to each inverted output terminal of the D-type flip-flops with an odd number as well as each non-inverted output terminal of the D-type flip-flops with an even number among the x D-type flip-flops, for generating the frequency indicating value.

18. The all digital phase locked loop circuit of claim 16, wherein the phase frequency detecting and time-to-digital circuit comprises:

n inverters, cascaded to each other, wherein an input terminal of the first inverter is used for receiving the frequency divided signal;

n D-type flip-flops, each of the D-type flip-flops having a data input terminal respectively coupled to an output terminal of the corresponding inverter, and each of the D-type flip-flops having a clock input terminal for receiving an inverted reference signal, wherein the inverted reference signal is a reverse of the reference signal; and a pseudo-thermometer-code edge detector, coupled to each inverted output terminal of the D-type flip-flops with an odd number as well as each non-inverted output terminal of the D-type flip-flops with an even number among the n D-type flip-flops, for generating the phase difference value.

19. The all digital phase locked loop circuit of claim 16, wherein the digital controller comprises:

a proportional control unit, for receiving the phase difference value, and for multiplying the phase difference value by a numeric of $K_P$ so as to output a proportional value, wherein the numeric of $K_P$ is controlled by the frequency indicating value;

an integrating control unit, for receiving the phase difference value, and for multiplying the phase difference value by a numeric of $K_I$ so as to output an integral value, wherein the numeric of $K_I$ is controlled by the frequency indicating value;

a delay unit, for receiving the control value, and for outputting a delay value in response to the control value;

a first adder, for adding the delay value and the integral value together so as to get a first value; and a second adder, for adding the first value and the proportional value together so as to get the control value.

20. The all digital phase locked loop circuit of claim 16, wherein the digital controlled oscillator comprises:

a bias current source, providing a plurality of current sources with different currents;

a digital-to-analog converting matrix, receiving the modulated control value, and dividing the modulated control value into a row value and a column value for enabling a part of the current sources among the bias current source, wherein the part of enabled current sources are aggregated into an analog current signal;

a current-to-voltage converter, receiving the analog current signal and converting the analog current signal into an analog voltage signal; and a voltage controlled oscillator (VCO), receiving the analog voltage signal and converting the analog voltage signal into the output oscillating signal.

21. The all digital phase locked loop circuit of claim 16, wherein the digital controlled oscillator comprises:

a bias current source, providing a plurality of current sources with different currents;

a digital-to-analog converting matrix, receiving the modulated control value, and dividing the modulated control value into a row value and a column value for enabling a part of the current sources among the bias current source, wherein the part of enabled current sources are aggregated into an analog current signal; and a current controlled oscillator, receiving the analog current signal, and converting the analog current signal into the output oscillating signal.

22. The all digital phase locked loop circuit of claim 16, wherein the digital controlled oscillator comprises:

an analog phase locked loop circuit, generating an output voltage controlled oscillating signal with a voltage controlled frequency; and a programmable frequency divider, for receiving the modulated control value and for generating a divisor, so that the output oscillating signal is generated by dividing the voltage controlled frequency of the output voltage controlled oscillating signal by the divisor.

* * * * *